(12) United States Patent
Sun et al.

(10) Patent No.: US 12,336,371 B2
(45) Date of Patent: Jun. 17, 2025

(54) LIGHT-EMITTING COMPONENT AND METHOD FOR MANUFACTURING THE SAME, DISPLAY SUBSTRATE AND DISPLAY DEVICE

(71) Applicant: BOE Technology Group Co., Ltd., Beijing (CN)

(72) Inventors: Meng Sun, Beijing (CN); Shuyun Xu, Beijing (CN); Hui Zhou, Beijing (CN); Lihui Ma, Beijing (CN); Xiaobo Du, Beijing (CN); Yansong Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 855 days.

(21) Appl. No.: 17/516,402

(22) Filed: Nov. 1, 2021

(65) Prior Publication Data

US 2022/0238834 A1 Jul. 28, 2022

(30) Foreign Application Priority Data

Jan. 22, 2021 (CN) .......................... 202110090322.X (51) Int. Cl.
*H01L 51/50* (2006.01)
*H10K 50/11* (2023.01)
(Continued)

(52) U.S. Cl.
CPC ........... *H10K 50/171* (2023.02); *H10K 50/11* (2023.02); *H10K 50/155* (2023.02);
(Continued)

(58) Field of Classification Search
None
See application file for complete search history.

(56) References Cited

U.S. PATENT DOCUMENTS

2007/0007882 A1* 1/2007 Fukuoka ................ H10K 50/19
252/301.16
2014/0361269 A1 12/2014 Kim et al.
(Continued)

FOREIGN PATENT DOCUMENTS

CN 105514292 A 4/2016
CN 109860407 A 6/2019
(Continued)

OTHER PUBLICATIONS

CN 202110090322.X second office action.
CN 202110090322.X first office action.

*Primary Examiner* — Gregory D Clark
(74) *Attorney, Agent, or Firm* — IPro, PLLC (57) ABSTRACT

The present application provides a light-emitting component and a method for manufacturing the same, a display substrate, and a display device. The light-emitting component comprises: an anode layer stacked on one side of a base, a first functional layer group including a plurality of functional layers, an organic light-emitting layer, a second functional layer group including a plurality of functional layers, and a cathode layer; the first functional layer group comprises a hole injection delaying layer close to the organic light-emitting layer, and the hole injection delaying layer is used for reducing a hole transport rate; and/or the second functional layer group comprises an electron injection delaying layer close to the organic light-emitting layer, and the electron injection delaying layer is used for reducing an electron transport rate.

19 Claims, 7 Drawing Sheets (51) Int. Cl.
  *H10K 50/155*  (2023.01)
  *H10K 50/165*  (2023.01)
  *H10K 50/17*  (2023.01)
  *H10K 71/00*  (2023.01)
  *H10K 101/40*  (2023.01)

(52) U.S. Cl.
  CPC ........... *H10K 50/165* (2023.02); *H10K 71/00* (2023.02); *H10K 2101/40* (2023.02)

(56) References Cited

U.S. PATENT DOCUMENTS

| | | | |
|---|---|---|---|
| 2018/0246581 A1* | 8/2018 | Omata | H10K 59/00 |
| 2020/0266375 A1 | 8/2020 | Li et al. | |
| 2022/0059782 A1* | 2/2022 | Chen | H10K 85/371 |

FOREIGN PATENT DOCUMENTS

| | | |
|---|---|---|
| CN | 209104191 U | 7/2019 |
| CN | 209592087 U | 11/2019 |
| KR | 20140144084 A | 12/2014 |

\* cited by examiner

| Cathode | ~500 |
| --- | --- |
| EIL | ~420 |
| ETL | ~410 |
| EML | ~300 |
| HTL | ~220 |
| HIL | ~210 |
| Anode | ~100 |

Fig. 1

| Cathode | ~500 | |
| --- | --- | --- |
| EIL | ~420 | 400 |
| ETL | ~410 | |
| EML | ~300 | |
| | ~230 | |
| HTL | ~220 | 200 |
| HIL | ~210 | |
| Anode | ~100 | |

```
preparing an anode layer on one side of a substrate, wherein the substrate
comprises a base and a switching device layer on the base, and the anode
layer is fabricated on one side of the switching device layer facing away
from the base
```

```
preparing a first functional layer group on
one side of the anode layer facing away from the substrate
```

```
sequentially preparing an organic light-emitting layer,
a second functional layer group and a cathode layer on
one side of the first functional layer facing away from the substrate
```

Fig. 14

LIGHT-EMITTING COMPONENT AND METHOD FOR MANUFACTURING THE SAME, DISPLAY SUBSTRATE AND DISPLAY DEVICE

CROSS-REFERENCE TO RELATED APPLICATIONS

This application claims priority to Chinese Patent Application No. 202110090322.X, filed in China on Jan. 22, 2021, the entire contents of which are hereby incorporated by reference.

TECHNICAL FIELD

The present application relates to the fields of display technology, and in particular to a light-emitting component and a method for manufacturing the same, a display substrate and a display device.

BACKGROUND

Organic light-emitting Diodes (OLEDs) are widely considered to be the most promising next-generation display and illumination technology due to their unique advantages of low driving voltage, fast response, wide color gamut and self-luminescence. Depending on the luminescent material, fluorescent OLEDs and phosphorescent OLEDs can be classified. Phosphorescent materials have a wide range of applications due to their ability to realize singlet and triplet excitons to participate in light emission, which can theoretically achieve 100% internal quantum efficiency.

However, most high efficiency phosphorescent devices face a common problem: the external quantum efficiency decreases sharply with increasing brightness, i.e. the efficiency rolls off. Phosphorescent device efficiency roll-off is primarily due to exciton Annihilation, including Triplet-Triplet Annihilation (TTA), and Exciton-Polaron quenching (TPA).

Therefore, in order to further advance the commercial implementation of OLEDs, there is a need to invent efficient, universally applicable new components to suppress the efficiency roll-off of phosphorescent OLED devices.

SUMMARY

In view of the shortcomings of the prior art, the present application proposes a light-emitting component and a method for manufacturing the same, a display substrate and a display device, so as to solve the technical problem of efficiency roll-off existing in the prior phosphorescent light-emitting device at a high current density.

According to one embodiment of the present application, there is provided a light-emitting component including: an anode layer stacked on one side of a base, a first functional layer group including a plurality of functional layers, an organic light-emitting layer, a second functional layer group including a plurality of functional layers, and a cathode layer;

the first functional layer group comprises a hole injection retarding layer close to the organic light-emitting layer, and the hole injection retarding layer is used for reducing a hole transport rate; and/or, the second functional layer group comprises an electron injection retarding layer close to the organic light-emitting layer, and the electron injection retarding layer is used for reducing an electron transport rate.

In one example, in a direction away from the anode layer, the first functional layer group comprises a hole transport layer and the hole injection retarding layer which are sequentially stacked; or the first functional layer group comprises a hole transport layer, wherein doping particles for reducing the hole transport rate are distributed in the hole transport layer, and the hole transport layer is reused as the hole injection retarding layer.

In one example, a HOMO level of the hole injection retarding layer is a first ionization energy, and a HOMO level of the hole transport layer is a second ionization energy; and an absolute value of the first ionization energy is greater than an absolute value of the second ionization energy.

In one example, a difference between the absolute value of the first ionization energy and the absolute value of the second ionization energy is 0.19 eV to 0.29 eV.

In one example, the material of the dopant particles comprises a planar aromatic compound having a conjugated structure.

In one example, the first functional layer group further comprises: an electron blocking layer located between the hole transport layer and the hole injection retarding layer for blocking electrons from entering the hole transport layer; and a HOMO energy level of the electron blocking layer is a third ionization energy, and the absolute value of the first ionization energy is greater than an absolute value of the third ionization energy.

In one example, a difference between the absolute value of the first ionization energy and the absolute value of the third ionization energy is 0.07 eV to 0.2 eV.

In one example, a ratio of a hole mobility of the electron blocking layer to a hole mobility of the hole injection retarding layer ranges from 10 to 100.

In one example, the hole injection retarding layer comprises a plurality of hole retarding sub-film layers which are stacked, and absolute values of HOMO levels corresponding to respective hole retarding sub-film layers in the hole injection retarding layer sequentially increase in a direction from the anode layer to the cathode layer.

In one example, the material of the hole injection retarding layer comprises a planar aromatic compound having a conjugated structure.

In one example, the material of the dopant particles comprises a planar aromatic compound having a conjugated structure.

In one example, in a direction away from the cathode layer, the second functional layer group comprises an electron transport layer and the electron injection retarding layer which are sequentially stacked; or the second functional layer group comprises an electron transport layer, wherein doping particles for reducing the electron transport rate are distributed in the electron transport layer, and the electron transport layer is reused as the electron injection retarding layer.

In one example, a LUMO level of the electron injection retarding layer is a fourth ionization energy, and a LUMO level of the electron transport layer is a fifth ionization energy; and an absolute value of the fourth ionization energy is greater than an absolute value of the fifth ionization energy.

In one example, a difference between the absolute value of the fourth ionization energy and the absolute value of the fifth ionization energy is 0.19 eV to 0.29 eV.

In one example, the second functional layer group further comprises: a hole blocking layer located between the electron transport layer and the electron injection retarding layer for blocking electrons from entering the electron transport layer; and a LUMO level of the hole blocking layer is a sixth ionization energy, and the absolute value of the fourth ionization energy is greater than an absolute value of the sixth ionization energy.

In one example, a difference between the absolute value of the fourth ionization energy and the absolute value of the sixth ionization energy is 0.07 eV to 0.2 eV.

In one example, a ratio of an electron mobility of the hole blocking layer to an electron mobility of the electron injection retarding layer ranges from 10 to 100.

In one example, the electron injection retarding layer comprises a plurality of electron retarding sub-film layers which are stacked, and absolute values of LUMO levels corresponding to respective electron retarding sub-film layers in the electron injection retarding layer sequentially increase in a direction from the cathode layer to the anode layer.

In one example, the material of the electron injection retarding layer comprises triazines or pyridine.

In one example, the first functional layer group further comprises a hole injection layer between the anode layer and the hole transport layer; the second functional layer group further comprises an electron injection layer located between the cathode layer and the electron transport layer; and/or the material of the organic light-emitting layer is a phosphorescent material.

According to one embodiment of the present application, there is provided a display substrate, including: a base, a switching device layer, and the above-mentioned light-emitting component; the switching device layer is provided for driving the light-emitting component to emit light.

According to one embodiment of the present application, there is provided a display device including the above-mentioned display substrate.

According to one embodiment of the present application, there is provided a method for making a light-emitting component, including the following steps:

forming an anode layer on one side of a substrate, the substrate including a base and a switching device layer on the base, the anode layer being formed on one side of the switching device layer facing away from the base;

forming a first functional layer group on one side of the anode layer facing away from the substrate;

sequentially forming an organic light-emitting layer, a second functional layer group and a cathode layer on one side of the first functional layer facing away from the substrate;

wherein the first functional layer group comprises a hole injection retarding layer for reducing a hole transport rate; and/or the second functional layer group comprises an electron injection retarding layer for reducing an electron transport rate.

The advantageous technical effects brought by the technical solutions provided in the embodiments of the present application at least include:

The light-emitting component or the manufacturing method provided in the embodiments of the present application can reduce the hole transport rate by providing a hole injection retarding layer, thereby being able to retard the injection of holes into the organic light-emitting layer at a high voltage (corresponding to a high current density), thereby reducing the exciton concentration between the hole transport layer and the organic light-emitting layer, and reducing exciton quenching, and/or can reduce the electron transport rate by providing a electron injection retarding layer, thereby being able to retard the injection of electrons into the organic light-emitting layer at a high voltage (corresponding to a high current density), thereby reducing the exciton concentration between the electron transport layer and the organic light-emitting layer, by reducing exciton quenching, the light emission efficiency of the device is improved, and the phenomenon of efficiency roll-off at high brightness is avoided, thereby improving the uneven display effect.

The light-emitting component or manufacturing method provided in the embodiments of the present application can further retard the injection of holes into the light-emitting layer at a high voltage (corresponding to a high current density) by providing a doped particle for reducing the hole transport rate in the hole transport layer, thereby reducing the exciton concentration at the interface of the hole transport layer and the organic light-emitting layer, reducing exciton quenching, improving the light-emitting efficiency of the device, avoiding the phenomenon of efficiency roll-off of the device at a high brightness, thereby improving the problem of uneven display effect. And/or by providing doping particles for reducing the electron transport rate in the electron transport layer, the injection of electrons into the organic light-emitting layer at a high voltage (corresponding to a high current density) can be retarded, thereby reducing the exciton concentration at the interface between the electron transport layer and the organic light-emitting layer, reducing exciton quenching, improving the light-emitting efficiency of the device, avoiding the phenomenon of efficiency roll-off of the device at a high brightness, thereby problem of uneven display effects can be overcome.

Additional aspects and advantages of the invention will be set forth in part in the description which follows and, in part, will be obvious from the description, or may be learned by practice of the invention.

BRIEF DESCRIPTION OF THE DRAWINGS

The foregoing and/or additional aspects and advantages of the present application will become apparent and more readily appreciated from the following description of the embodiments, taken in conjunction with the accompanying drawings, in which.

In the Figures:
- 100-anode layer;
- 200-first functional layer;
- 210-hole injection layer;
- 220-hole transport layer;
- 230-hole injection retarding layer; 231-hole retarding sub-film layer;
- 240-electron blocking layer;
- 300-organic light-emitting layer;
- 400-second functional layer;
- 410-electron transport layer;
- 420-electron injection layer;
- 430-hole blocking layer;
- 440-electron injection retarding layer, 441-electron retarding sub-film layer;
- 500-cathode layer.

DETAILED DESCRIPTION

Reference will now be made in detail to the present application, examples of embodiments of which are illustrated in the accompanying drawings, wherein like or similar reference numerals refer to the same or similar elements or elements having the same or similar function throughout. Further, if a detailed description of known technology is not necessary to illustrate the features of the present application, it is omitted. The embodiments described below by referring to the figures are exemplary only and should not be construed as limiting the present application.

It will be understood by those skilled in the art that, unless otherwise defined, all terms (including technical and scientific terms) used herein have the same meaning as commonly understood by one of ordinary skill in the art to which this application belongs. It will be further understood that terms, such as those defined in commonly used dictionaries, should be interpreted as having a meaning that is consistent with their meaning in the context of the prior art and will not be interpreted in an idealized or overly formal sense unless expressly so defined herein.

As used herein, the singular forms "a", "an", "the" and "the" are intended to include the plural forms as well, unless expressly stated otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes all or any unit and all combinations of one or more of the associated listed items.

The light emission principle of OLEDs is based on the injection of electrons from the cathode into the lowest unoccupied molecular orbital (LUMO) of the organic species and the injection of holes from the anode into the highest occupied molecular orbital (HOMO) of the organic species under the influence of an applied electric field. Electrons and holes meet and recombine in the organic light-emitting layer to form excitons. The excitons release energy in two ways: one is radiative transition, i.e., luminescence; two are non-radiative transitions, i.e., exotherms.

Figure 1:
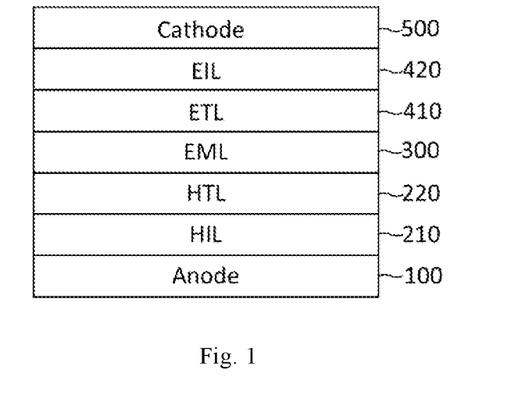
FIG. 1 is a schematic structural diagram of a light-emitting component provided in the related art.

In the structure shown in FIG. 1, in most cases, the injection and transport of electrons and holes are unbalanced, and when too many electrons or holes pass through the organic light-emitting layer 300 to reach the hole transport layer 220 or the electron transport layer 410, they combine with holes or electrons to form excitons. The inventors of the present application have found that the light-emitting component shown in FIG. 1 (a phosphorescent device structure) has a serious efficiency roll-off at a high current density, because the exciton emission center of the light-emitting component is at the interface of the hole transport layer 220 (shown as an HTL in the figure) and the organic light-emitting layer 300 (shown as an EML in the figure). Alternatively, the exciton emission center of the light-emitting component is at the interface of the electron transport layer 410 (shown schematically as an ETL) and the organic light emitting layer 300 (shown schematically as an EML).

When the exciton emission center of the light-emitting component is at the interface between the hole transport layer 220 and the organic light-emitting layer 300, at a low current density, when holes and electrons are injected into the organic light-emitting layer 300, a small amount of excitons are generated at the interface between the hole transport layer 220 and the organic light-emitting layer 300, so that the excitons can both radiatively transition and emit light with high efficiency. However, when the current density increases, holes and electrons are largely injected into the interior of the organic light-emitting layer 300, and at this time, the exciton concentration at the interface of the hole transport layer 220 and the organic light-emitting layer 300 sharply increases, a reaction occurs between a plurality of excitons, and between holes and excitons, resulting in exciton quenching, and non-radiative transitions of excitons increase due to triplet-triplet quenching and exciton-polaron (hole) quenching effects, resulting in a decrease in efficiency of the phosphorescent device, thereby causing a problem of uneven display.

When the exciton emission center of the light-emitting component is at the interface between the electron transport layer 410 and the organic light-emitting layer 300, at a low current density, when holes and electrons are injected into the organic light-emitting layer 300, a small amount of excitons are generated at the interface between the electron transport layer 410 and the organic light-emitting layer 300, so that the excitons can both radiatively transition and emit light with high efficiency. However, when the current density increases, holes and electrons are largely injected into the interior of the organic light-emitting layer 300, the exciton concentration at the interface of the electron transport layer 410 and the organic light-emitting layer 300 sharply increases, a reaction occurs between a plurality of excitons, and between electrons and excitons, resulting in exciton quenching, non-radiative transitions of excitons increase due to triplet-triplet quenching and exciton-polaron (hole) quenching effects, resulting in a decrease in efficiency of the phosphorescent device, and thus a problem of uneven display occurs.

The embodiments of the present application provide a light-emitting component and a manufacturing method thereof, a display substrate and a display device, aiming to solve the above-mentioned technical problem.

The technical solutions of the present application and how the technical solutions of the present application solve the above-mentioned technical problems are described in detail in the following specific embodiments.

Figure 2:
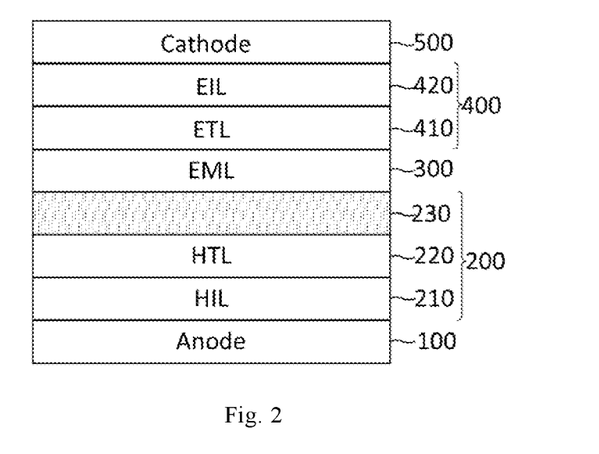
FIG. 2 is a schematic structural diagram of a light-emitting component provided in an embodiment of the present application.
Figure 3:
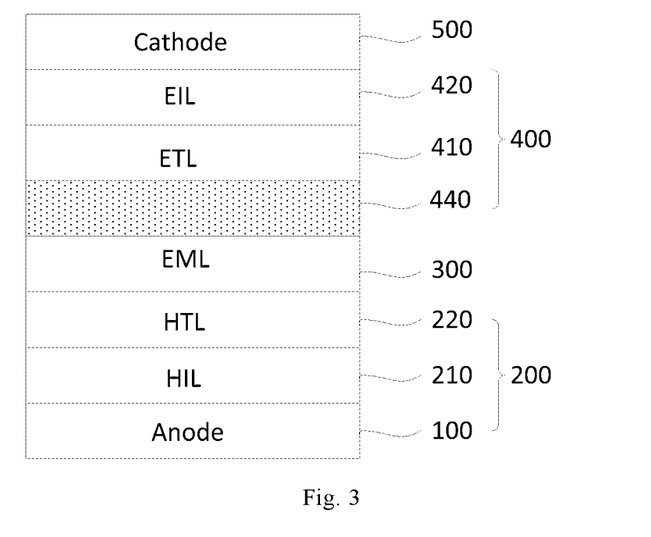
FIG. 3 is a schematic structural diagram of another light-emitting component provided in an embodiment of the present application.
Figure 4:
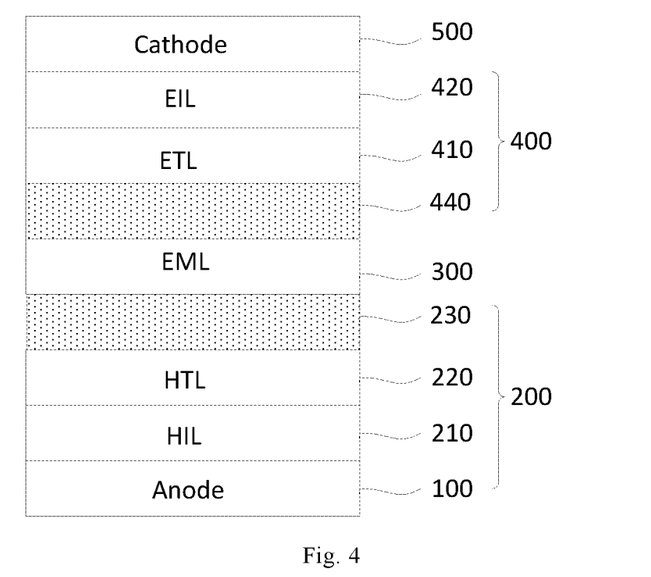
FIG. 4 is a schematic structural diagram of another light-emitting component provided in an embodiment of the present application.

With reference to FIGS. 2-4, in view of the above-mentioned technical problem, embodiments of the present application provide a light-emitting component, including: an anode layer 100, a first functional layer group 200 including a plurality of functional layers, an organic light-emitting layer 300, a second functional layer group 400 including a plurality of functional layers and a cathode layer 500 which are arranged on one side of a substrate in a laminated manner;

the first functional layer group 200 comprises a hole injection retarding layer 230 close to the organic light-emitting layer 300, and the hole injection retarding layer 230 is used for reducing the hole transport rate; and/or, the second functional layer group 400 includes an electron injection retarding layer 440 disposed close to the organic light emitting layer 300, and the electron injection retarding layer 440 serves to reduce a transfer rate of electrons.

Referring to FIG. 2, when the exciton emission center of the light-emitting component is at the interface of the hole transport layer 220 and the organic light emitting layer 300, in some embodiments of this embodiment, the first functional layer group 200 includes a hole injection retarding layer 230 disposed adjacent to the organic light emitting layer 300, the hole injection retarding layer 230 serving to reduce the transport rate of holes.

By providing the hole injection retarding layer 230 between the hole transport layer 220 and the organic light-emitting layer 300, the hole transport rate can be reduced, and then the injection of holes into the organic light-emitting layer 300 can be retarded under a high voltage (corresponding to a high current density), thereby reducing the exciton concentration at the interface between the hole transport layer 220 and the organic light-emitting layer 300, reducing exciton quenching, improving the light-emitting efficiency of the device, avoiding the phenomenon of efficiency roll-off at a high brightness of the device, and thus improving the problem of uneven display effect.

Referring to FIG. 3, when the exciton emission center of the light-emitting component is at the interface of the electron transport layer 410 and the organic light emitting layer 300, in some embodiments of this embodiment, the second functional layer group 400 includes a electron injection retarding layer 440 disposed adjacent to the organic light emitting layer 300, the electron injection retarding layer 440 serving to reduce the transfer rate of electrons.

By providing the electron injection retarding layer 440 between the electron transport layer 410 and the organic light-emitting layer 300, the electron transport rate can be reduced, and then electron injection into the organic light-emitting layer 300 can be retarded at a high voltage (corresponding to a high current density), thereby reducing the exciton concentration at the interface of the electron transport layer 410 and the organic light-emitting layer 300, reducing exciton quenching, improving the light-emitting efficiency of the device, avoiding the phenomenon of efficiency roll-off at a high brightness of the device, and thus improving the problem of uneven display effect.

Referring to FIG. 4, when the exciton emission center of the light-emitting component is at the interface of the hole transport layer 220 and the organic light-emitting layer 300, or when the exciton emission center of the light-emitting component is at the interface of the electron transport layer 410 and the organic light-emitting layer 300, in some embodiments of this embodiment, the first functional layer group 200 includes a hole injection retarding layer 230 disposed near the organic light-emitting layer 300, the hole injection retarding layer 230 is used to reduce the transport rate of holes. And the second functional layer group 400 comprises a electron injection retarding layer 440 close to the organic light-emitting layer 300, and the electron injection retarding layer 440 is used for reducing the electron transport rate.

Retarding the arrangement of the hole injection layer 230 can reduce the hole transport rate, and thus can retard the injection of holes into the organic light-emitting layer 300 under a high voltage (corresponding to a high current density); retarding the arrangement of the electron injection layer 440 can reduce the electron transport rate, and thus can retard the injection of electrons into the organic light-emitting layer 300 under a high voltage (corresponding to a high current density), thereby more effectively reducing the exciton concentration at the interface of the hole transport layer 220 and the organic light-emitting layer 300, or more effectively reducing the exciton concentration at the interface of the electron transport layer 410 and the organic light-emitting layer 300; by reducing exciton quenching, the light emission efficiency of the device is improved, and the phenomenon of efficiency roll-off at high brightness is avoided, thereby improving the uneven display effect.

As an alternative embodiment, the first functional layer group 200 includes a hole injection layer 210 (illustrated as an HIL in the figure), a hole transport layer 220 (illustrated as an HTL in the figure), and a hole injection retarding layer 230 for reducing the hole transport rate, which are sequentially stacked on the anode layer 100 (Anode).

In other embodiments, the first functional layer group 200 may include a hole injection layer 210 (shown schematically as an HIL) and a hole transport layer 220 (shown schematically as an HTL) sequentially stacked on the anode layer 100 (Anode). Wherein dopant particles for reducing the hole transport rate are distributed in the hole transport layer 220 to be reused as the hole injection retarding layer.

Optionally, the material of the anode layer 100 is indium tin oxide (ITO) to enhance electrical conductivity.

In this embodiment, by providing a hole injection retarding layer 230 between the hole transport layer 220 and the organic light-emitting layer 300 or mixing a dopant particle into the hole transport layer 220, the hole transport rate can be reduced, and then the injection of holes into the light-emitting layer can be retarded under a high voltage (corresponding to a high current density), thereby reducing the exciton concentration at the interface between the hole transport layer 220 and the organic light-emitting layer 300, reducing exciton quenching, improving the light-emitting efficiency of the device, avoiding the phenomenon of efficiency roll-off at a high brightness of the device, and thus improving the problem of uneven display effect.

In some embodiments, with continued reference to FIG. 2, the second functional layer group 400 includes an electron transport layer 410 (shown schematically as an ETL) and an electron injection layer 420 (shown schematically as an EIL) sequentially stacked on the organic light emitting layer 300.

In some embodiments, the material of the organic light emitting layer 300 is a phosphorescent material.

Figure 5:
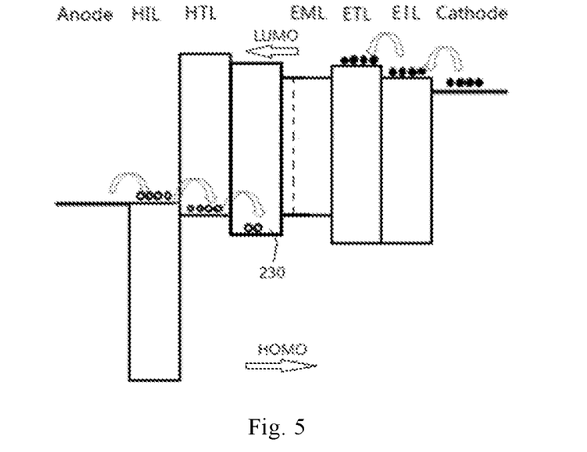
FIG. 5 is a schematic diagram showing carrier transition of a light-emitting component according to an embodiment of the present application.

FIG. 5 schematically shows a hole and electron transition diagram of a light-emitting component in an example of the present application. For convenience of description, the HOMO (highest occupied orbital) energy level of the hole injection retarding layer 230 is set as a first ionization energy, and the HOMO energy level of the hole transport layer 220 is set as a second ionization energy. Considering that the HOMO level is a negative value, in order to reduce the transport rate of holes at a high current density, the absolute value of the first ionization energy is greater than the absolute value of the second ionization energy, i.e., the HOMO level of the hole injection retarding layer 230 is deeper than the HOMO level of the hole transport layer 220.

Alternatively, the difference between the absolute value of the first ionization energy and the absolute value of the second ionization energy is 0.19 eV to 0.29 eV (inclusive), making transition of holes from the hole transport layer 220 to the hole injection retarding layer 230 more difficult, thereby reducing the transport rate of holes at high current densities, further reducing the exciton concentration at the interface of the hole transport layer 220 and the organic light emitting layer 300, improving the efficiency roll-off problem at high current densities.

In addition, the hole injection retarding layer 230 also has a shallow LUMO (lowest unoccupied molecular orbital) energy level, which can block the diffusion of electrons in the organic light emitting layer 300 to the hole transport layer 220.

In this embodiment, by defining the HOMO level parameter between the hole injection layer 230 and the hole transport layer 220, it is advantageous to reduce the hole transport rate, thereby reducing the efficiency roll-off and improving the display uniformity.

In some embodiments, the material of the retardation hole injection layer 230 may be a planar aromatic compound having a conjugated structure in consideration of the setting requirement of the HOMO level of the retardation hole injection layer 230.

Alternatively, the planar aromatic compound having a conjugated structure may be one or a mixture of both of a polyaryl-substituted triphenylamine derivative or a carbazole derivative.

In this embodiment, a planar aromatic compound having a conjugated structure is used as the material of the hole injection retarding layer 230, so that the HOMO level requirement of the hole injection retarding layer 230 can be satisfied, thereby achieving the purpose of reducing the hole transport rate at a high current density.

Figure 6:
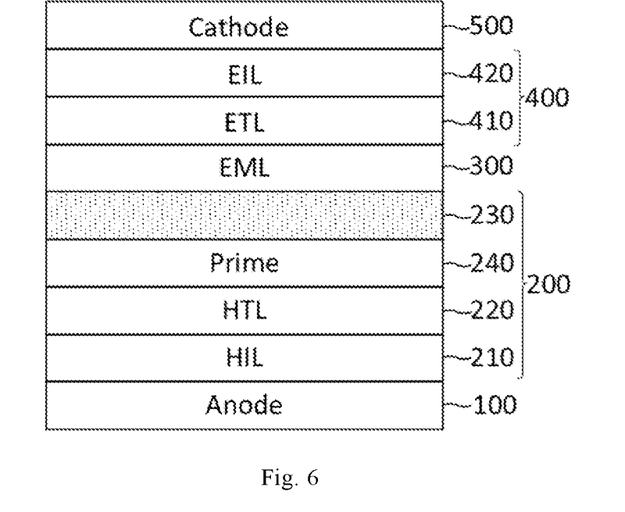
FIG. 6 is a schematic structural diagram of another light-emitting component provided in an embodiment of the present application.

In some embodiments, as shown in FIG. 6, an electron blocking layer 240 (shown schematically as Prime) is further provided between the hole transport layer 220 and the hole injection retarding layer 230 in the first functional layer 200. The electron blocking layer 240 can further inhibit electrons from entering the hole transport layer 220, thereby improving the light emitting efficiency of the device.

Specifically, the HOMO level of the electron blocking layer 240 is set to a third ionization energy, and the absolute value of the first ionization energy is greater than the absolute value of the third ionization energy.

Alternatively, the difference between the absolute value of the first ionization energy and the absolute value of the third ionization energy is 0.07ev-0.2ev, namely, the absolute value of the second ionization energy, the absolute value of the third ionization energy and the absolute value of the first ionization energy successively increase along the direction from the anode layer 100 to the cathode layer 500, facilitating the migration of holes, while reasonably controlling the hole transport rate at a high current density.

In this embodiment, providing an electron blocking layer 240 between the hole transport layer 220 and the hole injection retarding layer 230 can further inhibit electrons from entering the hole transport layer 220, so that the electrons remain in the organic light-emitting layer 300 as much as possible, thereby improving the light-emitting efficiency of the device; the definition of the HOMO energy level parameter of the electron blocking layer 240 is beneficial to the enhancement of the electron blocking effect, and the reasonable control of the hole transition rate can further enhance the light emitting efficiency of the device.

In some embodiments, in order to control the migration rate of holes to the organic light-emitting layer 300, the mobility of holes in the electron-blocking layer 240 is greater than the mobility of holes in the hole-retarding injection layer 230, i.e., the mobility of holes decreases the closer to the organic light-emitting layer 300.

Alternatively, the ratio of the hole mobility of the electron blocking layer 240 to the hole mobility of the hole injection retarding layer 230 ranges from 10 to 100, inclusive.

Alternatively, the ratio of the hole mobility of the electron blocking layer 240 to the hole mobility of the hole injection retarding layer 230 is 50.

Figure 7:
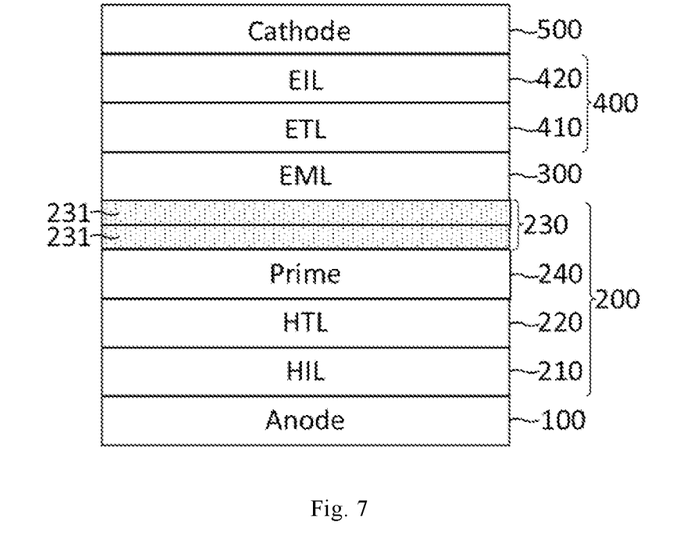
FIG. 7 is a schematic structural diagram of yet another light-emitting component provided in an embodiment of the present application.

In some embodiments, as shown in FIG. 7, the retarding hole injection layer 230 comprises a plurality of retarding hole sub-film layers 231 which are stacked. Wherein the absolute value of the HOMO energy levels corresponding to each of the hole retarding sub-film layers 231 in the hole injection retarding layer 230 increases successively in the direction from the anode layer 100 to the cathode layer 500.

It should be noted that the material for forming each of the hole-retarding sub-film layers 231 may be the same, and this may be achieved by setting different thicknesses, adjusting the concentration and ratio of the material for forming the hole-retarding injection layer 230, etc. In addition, the material of each of the retardation hole sub-film layers 231 may be different as long as the HOMO level of each retardation hole sub-film layer can satisfy the corresponding change trend.

In some embodiments, the doping concentration of the dopant particles in the hole transport layer 220 may be set according to the HOMO level requirements of the hole transport layer 220 to be prepared, and the doping concentration of the dopant particles is not particularly limited in this embodiment. The material of the doped particles may likewise comprise a planar aromatic compound having a conjugated structure.

Alternatively, the planar aromatic compound having a conjugated structure may be one or a mixture of both of a polyaryl-substituted triphenylamine derivative or a carbazole derivative.

In this embodiment, a planar aromatic compound having a conjugated structure is used as the material of the dopant particles distributed in the hole transport layer 220, so that the HOMO level requirement of the hole transport layer can be satisfied, thereby achieving the purpose of reducing the hole transport rate at a high current density.

Figure 8:
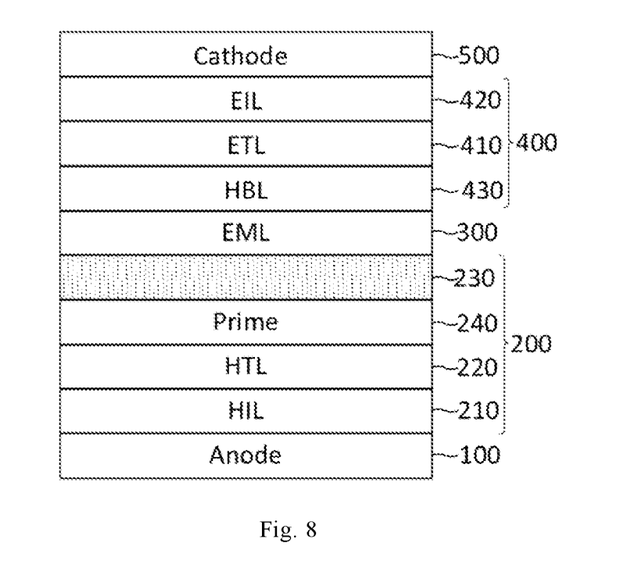
FIG. 8 is a schematic structural diagram of still another light-emitting component provided in an embodiment of the present application.

In some embodiments, as shown in FIG. 8, a hole blocking layer 430 (illustrated as HBL) is provided between the electron transport layer 410 and the organic light emitting layer 300, and the hole blocking layer 430 serves to block holes from entering the electron transport layer 410 so that holes remain in the organic light emitting layer 300 as much as possible, further improving the light emitting efficiency of the device.

Referring to FIG. 3, as an alternative embodiment, the second functional layer group 400 includes an electron injection layer 420 (illustrated as an EIL), an electron transport layer 410 (illustrated as an ETL), and a electron injection retarding layer 440 sequentially stacked on the cathode layer 500 (Cathode), the electron injection retarding layer 230 serving to reduce the electron transfer rate.

In other embodiments, the second functional layer group 400 may include an electron injection layer 420, a hole transport layer 410, sequentially stacked on the cathode layer 500. Wherein doped particles for reducing the electron transport rate are distributed in the electron transport layer 410 so as to be reused as the electron injection retarding layer, namely, the electron transport layer 410 and the electron injection retarding layer 440 are provided integrally.

In this embodiment, by providing a electron injection retarding layer 440 between the electron transport layer 410 and the organic light-emitting layer 300 or mixing a dopant particle into the electron transport layer 410, the electron transport rate can be reduced, and then electron injection into the light-emitting layer can be retarded at a high voltage (corresponding to a high current density), thereby reducing the exciton concentration at the interface between the electron transport layer 410 and the organic light-emitting layer 300, reducing exciton quenching, improving the light-emitting efficiency of the device, avoiding the phenomenon of efficiency roll-off at a high brightness of the device, and thus improving the problem of uneven display effect.

In some embodiments, with continued reference to FIG. 3, the first functional layer group 200 includes a hole transport layer 220 (shown schematically as an HTL) and a hole injection layer 210 (shown schematically as an HIL) sequentially stacked on the organic light emitting layer 300.

In some embodiments, the material of the organic light emitting layer 300 is a phosphorescent material.

FIG. 5 schematically shows a hole and electron transition diagram of a light-emitting component in an example of the present application. For convenience of description, the LUMO (lowest unoccupied molecular orbital) energy level of the electron injection retarding layer 440 is set to the fourth ionization energy, and the LUMO energy level of the electron transport layer 410 is set to the fifth ionization energy. Considering that the LUMO level is a negative value, in order to reduce the electron transport rate at a high current density, the absolute value of the fourth ionization energy is greater than the absolute value of the fifth ionization energy, i.e. the LUMO level of the electron injection retarding layer 440 is deeper than the LUMO level of the electron transport layer 410.

Alternatively, the difference between the absolute value of the fourth ionization energy and the absolute value of the fifth ionization energy is 0.19 eV to 0.29 eV (inclusive), making it more difficult for electrons to transition from the electron transport layer 410 to the electron injection retarding layer 440, thereby reducing the electron transport rate at high current densities, further reducing the exciton concentration at the interface of the electron transport layer 410 and the organic light emitting layer 300, improving the efficiency roll-off problem at high current densities.

In addition, the electron injection retarding layer 440 also has a shallow HOMO (highest occupied orbital) energy level, which can block holes in the organic light emitting layer 300 from diffusing to the electron transport layer 410.

In this embodiment, by defining the LUMO level parameter between the electron injection retarding layer 440 and the electron transport layer 410, it is advantageous to reduce the electron transport rate, thereby reducing the efficiency roll-off and improving the display uniformity.

In some embodiments, the material of the retardation electron injection layer 440 may be triazine or pyridine in consideration of the setting requirement of the LUMO level of the retardation electron injection layer 440.

In this embodiment, the use of triazines or pyridine as the material of the electron injection retarding layer 440 can satisfy the requirement of the LUMO level of the electron injection retarding layer 440, thereby achieving the purpose of reducing the electron transport rate at a high current density.

Figure 9:
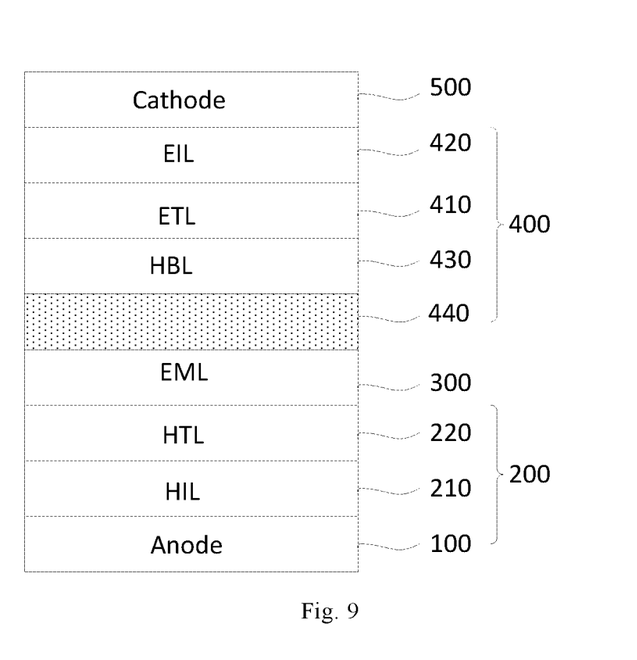
FIG. 9 is a schematic structural diagram of another light-emitting component provided in an embodiment of the present application.

In some embodiments, as shown in FIG. 9, a hole blocking layer 430 (illustrated as HBL) is further provided between the electron transport layer 410 and the electron injection retarding layer 440 in the second functional layer group 400. The hole blocking layer 430 can further inhibit holes from entering the electron transport layer 410, thereby improving the light emitting efficiency of the device.

Specifically, the LUMO level of the hole blocking layer 430 is set to the sixth ionization energy, and the absolute value of the fourth ionization energy is greater than the absolute value of the sixth ionization energy.

Alternatively, the difference between the absolute value of the fourth ionization energy and the absolute value of the sixth ionization energy is 0.07ev-0.2ev, namely, the absolute value of the fifth ionization energy, the absolute value of the sixth ionization energy and the absolute value of the fourth ionization energy successively increase along the direction from the cathode layer 500 to the anode layer 100, facilitating the migration of electrons, and at the same time, reasonably controlling the electron transport rate at a high current density.

In this embodiment, providing a hole blocking layer 430 between the electron transport layer 410 and the electron injection retarding layer 440 can further inhibit holes from entering the electron transport layer 410, so that holes remain in the organic light-emitting layer 300 as much as possible, thereby improving the light-emitting efficiency of the device; the definition of the LUMO energy level parameter of the hole blocking layer 430 is beneficial to the enhancement of the hole blocking effect, and the reasonable control of the electron transition rate can further enhance the light emitting efficiency of the device.

In some embodiments, in order to control the rate of electron migration to the organic light-emitting layer 300, the electron mobility in the hole-blocking layer 430 is greater than the electron mobility in the electron-injecting layer 440 is retarded, i.e. the closer to the organic light-emitting layer 300, the electron mobility decreases.

Alternatively, the ratio of the electron mobility of the hole blocking layer 430 to the electron mobility of the electron injection retarding layer 440 ranges from 10 to 100, inclusive.

Alternatively, the ratio of the electron mobility of the hole blocking layer 430 to the electron mobility of the electron injection retarding layer 440 is 50.

Figure 10:
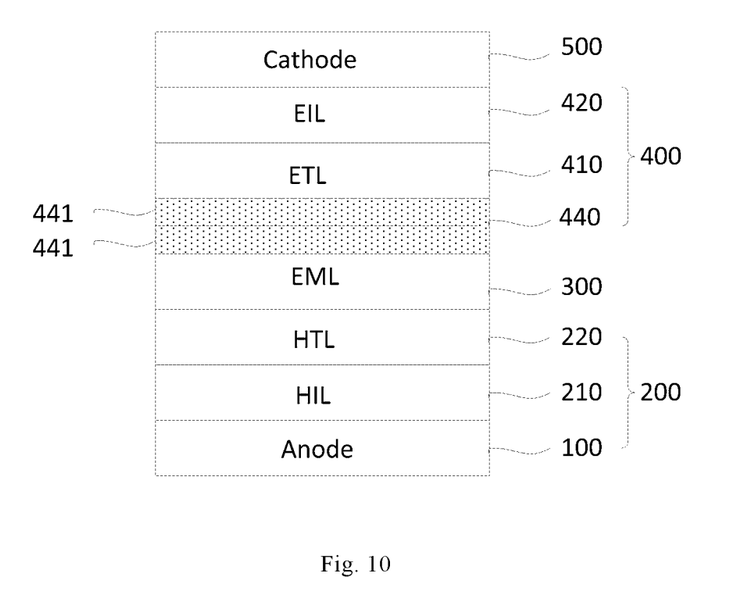
FIG. 10 is a schematic structural diagram of another light-emitting component provided in an embodiment of the present application.

In some embodiments, as shown in FIG. 10, the electron injection retarding layer 440 comprises a plurality of retarding electron sub-film layers 441 which are stacked. The absolute value of the LUMO energy level corresponding to each of the electron retardation film layers 441 in the electron retardation injection layer 440 increases successively from the cathode layer 500 to the anode layer 100.

It should be noted that each of the retardation electron film layers 441 may be made of the same material, by setting different thicknesses, adjusting the concentration and ratio of the material for making the retardation electron injection layer 440, etc. In addition, the material of each of the retardation electron film layers 441 may be different as long as the LUMO level of each of the retardation electron film layers can satisfy the corresponding change trend.

In some embodiments, the doping concentration of the dopant particles in the electron transport layer 410 may be set according to the LUMO level requirements of the electron transport layer 410 to be prepared, and the doping concentration of the dopant particles is not particularly limited in this embodiment. The material of the doping particles may likewise comprise triazines or pyridine.

In this embodiment, triazine or pyridine is used as the material of the dopant particles distributed in the electron transport layer 410, so that the requirements of the electron transport layer 410 for the LUMO level can be satisfied, thereby reducing the electron transport rate at a high current density.

In some embodiments, as shown in FIG. 8, an electron blocking layer 240 (shown schematically as Prime) is provided between the hole transport layer 220 and the organic light emitting layer 300, and the electron blocking layer 240 serves to block electrons from entering the hole transport layer 220 so that electrons remain in the organic light emitting layer 300 as much as possible, further improving the light emitting efficiency of the device.

Figure 11:
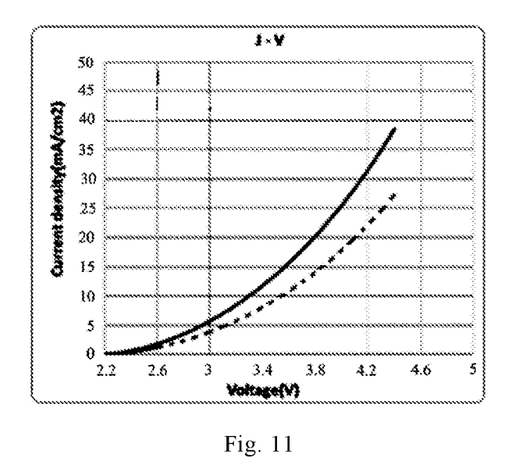
FIG. 11 is a graph showing comparison between current density-voltage relationships of a light-emitting component according to an embodiment of the present application with that a light-emitting component of the related art.
Figure 12:
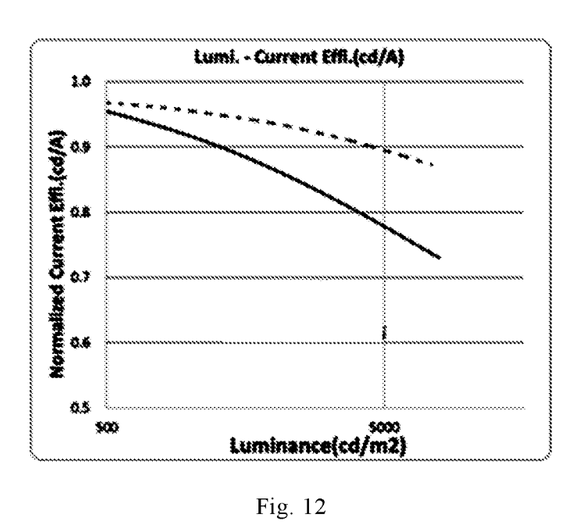
FIG. 12 is a graph showing comparison between luminance-luminous efficiency relationships of a light-emitting component according to an embodiment of the present application and a light-emitting component of the related art.
Figure 13:
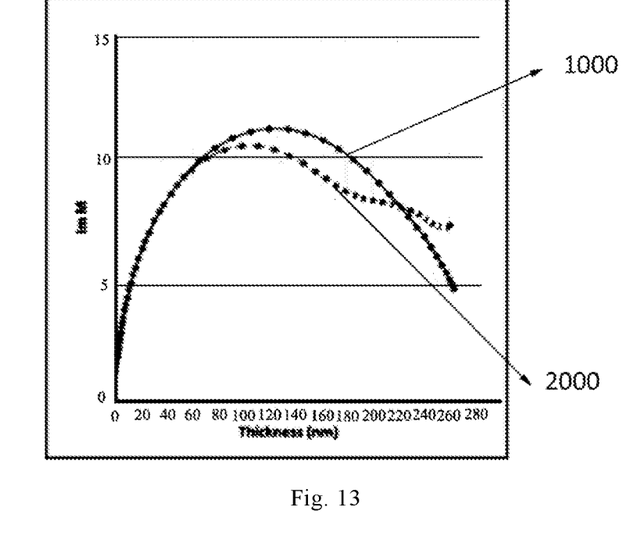
FIG. 13 is a graph showing comparison between impedance spectrums of a light-emitting component according to an embodiment of the present application and a light-emitting component of the related art.

In order to explain the effect of the addition of the hole injection retarding layer 230 and/or the addition of the electron injection retarding layer 440 on the efficiency roll-off in the light-emitting component, the comparative analysis results as described in FIGS. 11 to 13 are obtained by specifically analyzing the data of the comparative structure (as shown in FIG. 1) and the retarded hole injection structure (as shown in FIG. 2 or FIG. 6) in the embodiments of the present application.

As shown in FIG. 11 and FIG. 12, the solid lines in FIG. 11 and FIG. 12 both correspond to the comparative structure shown in FIG. 1, and the dotted lines both correspond to the retarded hole injection structure shown in FIG. 2 or FIG. 6. The comparative structure (shown in FIG. 1) is an OLED (organic electroluminescent diode) device with more severe efficiency roll-off, and the hole injection retarding layer 230 is not evaporated, resulting in a device with a faster hole transport rate at a voltage of 2.4 V, thus producing a more significant efficiency roll-off at high gray levels. This is because holes are rapidly injected into the organic light-emitting layer 300 at a high current density, resulting in generation of a large amount of excitons at the interface of the hole transport layer 220 and the organic light-emitting layer 300, and exciton quenching occurs, so that the exciton transition light-emitting efficiency decreases. The light-emitting component provided in this embodiment can significantly reduce the hole transport rate at high voltage of the device, reduce the exciton concentration at the interface of the hole transport layer 220 and the organic light-emitting layer 300 by adding the retardation hole injection layer 230, thereby reducing exciton quenching, improving the light-emitting efficiency and improving the efficiency roll-off phenomenon at high luminance of the device.

To further illustrate the effect of retarding hole injection layer 230 to block hole injection, we tested the impedance spectra of the comparative structure and the retarding hole injection structure at a frequency of 1-1000000 Hz, a DC voltage of 2.4 V, and an AC signal voltage of 100 mV. The test results are shown in FIG. 13. In FIG. 13, graph 1000 corresponds to the comparative structure shown in FIG. 1, and graph 2000 corresponds to the retarded hole injection structure shown in FIG. 2. The impedance spectrum of the retarded hole injection structure is two semi-circles (refer to graph 2000). The light-emitting component in the embodiment of the present application can be equivalent to two RC circuits, and there is an obvious interface between interfaces in the device (the arrangement of the hole injection retarding layer 230 reduces the hole transport rate, so that charges accumulate at the interface of the hole injection retarding layer 230 and the hole transport layer 22). The impedance spectrum of the comparative structure is a complete semi-circle (reference pattern 1000), demonstrating a faster hole transport rate within the device.

Based on the same inventive concept, embodiments of the present application also provide a display substrate, including: a base, a switching device layer, and the above-mentioned light-emitting component in the embodiments of the present application, wherein the switching device layer is used for driving the light-emitting component to emit light.

A display substrate provided in an embodiment of the present application comprises the light-emitting component in each of the preceding embodiments, wherein the light-emitting component can retard hole injection into the organic light-emitting layer under a high voltage (corresponding to a high current density) by adding a retarding hole injection layer 230, thereby reducing the exciton concentration at the interface of the hole transport layer 220 and the organic light-emitting layer 300; and/or adding the electron injection retarding layer 440 can retard the injection of electrons into the organic light-emitting layer under a high voltage (corresponding to a high current density), thereby reducing the exciton concentration at the interface of the electron transport layer 410 and the organic light-emitting layer 300, reducing exciton quenching, improving the light-emitting efficiency of the device, avoiding the phenomenon of efficiency roll-off of the device under a high brightness, thereby improving the problem of uneven display effects.

Based on the same inventive concept, embodiments of the present application also provide a display device including the display substrate as described above in the embodiments of the present application.

Figure 14:
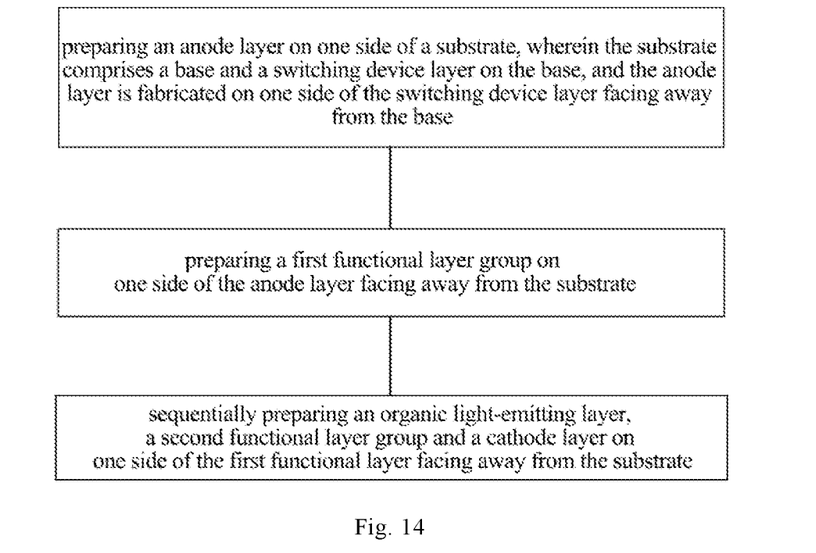
FIG. 14 is a flow chart showing a method for making a display substrate according to an embodiment of the present application.

A display device provided in this embodiment comprises the display substrate in the preceding embodiment, wherein a light-emitting component in the display substrate is provided with a hole injection retarding layer 230 between the hole transport layer 220 and the organic light-emitting layer 300, and hole injection into the organic light-emitting layer can be retarded under a high voltage (corresponding to a high current density) so as to reduce the exciton concentration at the interface of the hole transport layer 220 and the organic light-emitting layer 300; and/or adding a electron injection retarding layer 440, which can retard the injection of electrons into the organic light-emitting layer under a high voltage (corresponding to a high current density), thereby reducing the exciton concentration at the interface of the electron transport layer 410 and the organic light-emitting layer 300, reducing exciton quenching, improving the light-emitting efficiency of the device, avoiding the phenomenon of efficiency roll-off of the device under a high brightness, and thereby improving the problem of uneven display effect Based on the same inventive concept, the embodiments of the present application also provide a method for making a light-emitting component, as shown in FIG. 10, including the following steps S100-S300:

S100, an anode layer is formed on one side of a substrate, the substrate including a base and a switching device layer located on the base, the anode layer being formed on the side of the switching device layer facing away from the base.

Alternatively, the substrate is typically a glass substrate. The switching device layer comprises a thin film transistor device arranged in an array, and the switching device layer and the anode layer can generally be formed by a combination of overall film-forming and patterning processes. In addition, an anode layer of a material similar to ITO can also be formed by sputtering.

S200, a first functional layer group is formed on the side of the anode layer facing away from the substrate; the first functional layer group comprises a hole injection layer, a hole transport layer and a hole injection retarding layer which are sequentially stacked on the anode layer, wherein the hole injection retarding layer is used for reducing the hole transport rate; alternatively, the first functional layer group comprises a hole injection layer and a hole transport layer laminated successively on the anode layer, wherein the hole transport layer is distributed with dopant particles for reducing the hole transport rate, and the hole transport layer is reused as a hole injection retarding layer.

Alternatively, after the cleaning of the anode layer is completed, a first functional layer group including a hole injection layer, a hole transport layer, and a hole injection retarding layer is formed on the anode layer using an evaporation process. The material of the hole injection retarding layer may be a planar aromatic compound having a conjugated structure to satisfy the setting requirement of the HOMO level of the hole injection retarding layer, further improving the effect.

Alternatively, after the cleaning of the anode layer is completed, a first functional layer group including a hole injection layer and a hole transport layer having dopant particles distributed thereon is formed on the anode layer using an evaporation process, and the dopant particles may be mixed with a material for forming the hole transport layer in advance. The material doped with particles can also adopt a planar aromatic compound having a conjugated structure (doped in the form of particles in the material for forming the hole transport layer) so as to satisfy the setting requirement of the HOMO level of the hole injection retarding layer and further improve the effect.

S300, an organic light-emitting layer, a second functional layer and a cathode layer are successively formed on one side of the first functional layer group facing away from the substrate.

Alternatively, after the cleaning of the anode layer is completed, the organic light-emitting layer, the second functional layer group and the cathode layer may be formed using an evaporation process. Wherein the second functional layer group may comprise a electron injection retarding layer, an electron transport layer and an electron injection layer which are laminated on the organic light-emitting layer, or the second functional layer group may comprise an electron transport layer and an electron injection layer which are laminated on the organic light-emitting layer, wherein the electron transport layer is distributed with dopant particles for reducing the electron transport rate, i.e. the electron transport layer is reused as a electron injection retarding layer.

Alternatively, the second functional layer group including the electron transport layer and the electron injection layer in which the dopant particles are distributed is formed on the organic light emitting layer by an evaporation process, and the dopant particles may be mixed with the material for forming the electron transport layer in advance. The material doped with particles can also adopt triazines or pyridine (doped in the form of particles in the material for forming the electron transport layer) so as to satisfy the setting requirement of the LUMO energy level of the electron injection retarding layer and further improve the effect In some embodiments, preparation of a film layer structure, such as an encapsulating layer, is also performed after preparation of the cathode layer.

In this embodiment, by providing a hole injection retarding layer 230 between the hole transport layer 220 and the organic light-emitting layer 300 or mixing a doped particle in the hole transport layer, hole injection into the light-emitting layer can be retarded under a high voltage (corresponding to a high current density), thereby reducing the exciton concentration at the interface of the hole transport layer 220 and the organic light-emitting layer 300; and/or by providing a electron injection retarding layer 440 between the electron transport layer 410 and the organic light-emitting layer 300 or mixing a doping particle in the electron transport layer, electron injection into the light-emitting layer can be retarded under a high voltage (corresponding to a high current density), thereby reducing the exciton concentration at the interface of the electron transport layer 410 and the organic light-emitting layer 300; by reducing exciton quenching, the light emission efficiency of the device is improved, and the phenomenon of efficiency roll-off at high brightness is avoided, thereby improving the uneven display effect.

The embodiments of the present application have at least the following technical effects:

1, by providing a hole injection retarding layer between the hole transport layer and the organic light-emitting layer, the hole injection retarding layer can retard hole injection into the light-emitting layer under a high voltage (corresponding to a high current density), thereby reducing the exciton concentration at the interface of the hole transport layer and the organic light-emitting layer; by providing a electron injection retarding layer between the electron transport layer and the organic light-emitting layer, electron injection into the light-emitting layer can be retarded under a high voltage (corresponding to a high current density), thereby reducing the exciton concentration at the interface of the electron transport layer and the organic light-emitting layer; by reducing exciton quenching, the light emission efficiency of the device is improved, and the phenomenon of efficiency roll-off at high brightness is avoided, thereby improving the uneven display effect.

2, by providing the doped particles in the hole transport layer, since the doped particles can retard hole injection into the light-emitting layer under a high voltage (corresponding to a high current density), thereby reducing the exciton concentration at the interface of the hole transport layer and the organic light-emitting layer; and/or by providing doping particles in the electron transport layer, since the doping particles can retard the injection of electrons into the light-emitting layer under a high voltage (corresponding to a high current density), thereby reducing the exciton concentration at the interface of the electron transport layer and the organic light-emitting layer to reduce exciton quenching, improving the light-emitting efficiency of the device, avoiding the phenomenon of efficiency roll-off of the device under a high brightness, and thereby improving the problem of uneven display effects.

3, by defining the HOMO energy level parameter between the hole injection layer and the hole transport layer, the transport rate of holes can be reduced, thereby reducing the efficiency roll-off and improving the display uniformity.

4, by defining the LUMO level parameter between the electron injection layer and the electron transport layer, the electron transport rate is reduced, thereby reducing the efficiency roll-off and improving the display uniformity.

5, the use of a planar aromatic compound having a conjugated structure in the material of the hole injection retarding layer can satisfy the requirement of the HOMO level of the hole injection retarding layer, thereby achieving the purpose of retarding the hole transport rate at a high current density.

6, the use of triazines or pyridine as the material of the electron injection retarding layer can satisfy the requirement of the LUMO energy level of the electron injection retarding layer, thereby achieving the purpose of retarding the electron transport rate at a high current density.

7, providing an electron blocking layer between the hole transport layer and the hole injection retarding layer, so as to further inhibit electrons from entering the hole transport layer, so that the electrons remain in the organic light-emitting layer as much as possible, thereby improving the light-emitting efficiency of the device; limiting the HOMO energy level parameter of the electron blocking layer is helpful to improve the blocking effect of electrons, and can also control the transition rate of holes reasonably, further improving the light emitting efficiency of the device.

8, A hole blocking layer is provided between the electron transport layer and the organic light-emitting layer, and the hole blocking layer serves to block holes from entering the electron transport layer, so that holes remain in the organic light-emitting layer as much as possible, further improving the light-emitting efficiency of the device.

In the description of the present application, it is to be understood that the directional or positional relationships indicated by the terms "center", "upper", "lower", "front", "back", "left", "right", "vertical", "horizontal", "top", "bottom", "inner", "outer", and the like, are those based on the orientation or positional relationships shown in the drawings, merely to facilitate and simplify the description of the present application, and do not indicate or imply that the referenced devices or elements must have a particular orientation, be constructed and operated in a particular orientation, and thus should not be construed as limiting the present application.

The terms "first" and "second" are used for descriptive purposes only and are not to be construed as indicating or implying relative importance or as implicitly designating the number of technical features indicated. Thus, a feature defined as "first" or "second" may explicitly or implicitly comprise one or more of the feature. In the description of the present application, the meaning of "a plurality" is two or more unless otherwise specified.

In the description of the present application, it should be noted that, unless expressly stated or limited otherwise, the terms "mounted", "connected", and "connected" are to be interpreted broadly, and may, for example, be fixedly connected, detachably connected, or integrally connected; it can be directly connected or indirectly connected through an intermediate medium, and can be the communication between two elements. For a person skilled in the art, the specific meaning of the above terms in the present application can be understood in detail.

In the description of the specification, particular features, structures, materials, or characteristics may be combined in any suitable manner in any one or more embodiments or examples.

While the foregoing is directed to embodiments of the present invention, other and further embodiments of the invention may be devised without departing from the basic scope thereof, and the scope thereof is determined by the claims that follow.

What is claimed is:

1. A light-emitting component, comprising: an anode layer, a first functional layer group comprising a plurality of functional layers, an organic light-emitting layer, a second functional layer group comprising a plurality of functional layers, and a cathode layer, which layers are stacked on one side of a base;

the first functional layer group comprises a hole injection retarding layer close to the organic light-emitting layer, and the hole injection retarding layer is used for reducing a hole transport rate; and/or, the second functional layer group comprises an electron injection retarding layer close to the organic light-emitting layer, and the electron injection retarding layer is used for reducing an electron transport rate;

wherein in a direction away from the anode layer, the first functional layer group comprises a hole transport layer and the hole injection retarding layer stacked sequentially; or the first functional layer group comprises a hole transport layer, wherein doping particles for reducing the hole transport rate are distributed in the hole transport layer, and the hole transport layer is reused as the hole injection retarding layer.

2. The light-emitting component according to claim 1, wherein a HOMO level of the hole injection retarding layer is a first ionization energy, and a HOMO level of the hole transport layer is a second ionization energy; and an absolute value of the first ionization energy is greater than an absolute value of the second ionization energy.

3. The light-emitting component according to claim 2, wherein a difference between the absolute value of the first ionization energy and the absolute value of the second ionization energy is 0.19 eV to 0.29 eV.

4. The light-emitting component of claim 2, wherein the first functional layer group further comprises: an electron blocking layer located between the hole transport layer and the hole injection retarding layer for blocking electrons from entering the hole transport layer;

a HOMO energy level of the electron blocking layer is a third ionization energy, and the absolute value of the first ionization energy is greater than an absolute value of the third ionization energy; and a difference between the absolute value of the first ionization energy and the absolute value of the third ionization energy is 0.07 eV to 0.2 eV.

5. The light-emitting component according to claim 4, wherein a ratio of a hole mobility of the electron blocking layer to a hole mobility of the hole injection retarding layer ranges from 10 to 100.

6. The light-emitting component according to claim 1, wherein the hole injection retarding layer comprises a plurality of hole retarding sub-film layers which are stacked, and absolute values of HOMO levels corresponding to respective hole retarding sub-film layers in the hole injection retarding layer sequentially increase in a direction from the anode layer to the cathode layer.

7. The light-emitting component according to claim 1, wherein the material of the hole injection retarding layer comprises a planar aromatic compound having a conjugated structure.

8. The light-emitting component according to claim 1, wherein the material of the dopant particles comprises a planar aromatic compound having a conjugated structure.

9. The light-emitting component according to claim 1, wherein, in a direction away from the cathode layer, the second functional layer group comprises an electron transport layer and the electron injection retarding layer which are sequentially stacked; or the second functional layer group comprises an electron transport layer, wherein doping particles for reducing the electron transport rate are distributed in the electron transport layer, and the electron transport layer is reused as the electron injection retarding layer.

10. The light-emitting component according to claim 9, wherein a LUMO level of the electron injection retarding layer is a fourth ionization energy, and a LUMO level of the electron transport layer is a fifth ionization energy; and an absolute value of the fourth ionization energy is greater than an absolute value of the fifth ionization energy.

11. The light-emitting component according to claim 10, wherein a difference between the absolute value of the fourth ionization energy and the absolute value of the fifth ionization energy is 0.19 eV to 0.29 eV.

12. The light-emitting component according to claim 9, wherein the second functional layer group further comprises: a hole blocking layer located between the electron transport layer and the electron injection retarding layer for blocking electrons from entering the electron transport layer;

a LUMO level of the hole blocking layer is a sixth ionization energy, and the absolute value of the fourth ionization energy is greater than an absolute value of the sixth ionization energy; and a difference between the absolute value of the fourth ionization energy and the absolute value of the sixth ionization energy is 0.07 eV to 0.2 eV.

13. The light-emitting component according to claim 12, wherein a ratio of an electron mobility of the hole blocking layer to an electron mobility of the electron injection retarding layer ranges from 10 to 100.

14. The light-emitting component according to claim 9, wherein the electron injection retarding layer comprises a plurality of electron retarding sub-film layers which are stacked, and the absolute values of LUMO levels corresponding to respective electron retarding sub-film layers in the electron injection retarding layer sequentially increase in a direction from the cathode layer to the anode layer.

15. The light-emitting component according to claim 9, wherein the material of the electron injection retarding layer comprises triazines or pyridine.

16. The light-emitting component of claim 1, wherein the first functional layer group further comprises a hole injection layer between the anode layer and the hole transport layer; the second functional layer group further comprises an electron injection layer located between the cathode layer and the electron transport layer; and/or the material of the organic light-emitting layer is a phosphorescent material.

17. A display substrate, comprising: a base, a switching device layer, and the light-emitting component of claim 1, wherein the switching device layer is provided for driving the light-emitting component to emit light.

18. A display device, comprising the display substrate of claim 17.

19. A method for manufacturing a light-emitting component, comprising the following steps:

forming an anode layer on one side of a substrate, the substrate comprising a base and a switching device layer on the base, the anode layer being formed on one side of the switching device layer facing away from the base;

forming a first functional layer group on one side of the anode layer facing away from the substrate;

sequentially forming an organic light-emitting layer, a second functional layer group and a cathode layer on one side of the first functional layer facing away from the substrate;

wherein the first functional layer group comprises a hole injection retarding layer for reducing a hole transport rate; and/or the second functional layer group comprises an electron injection retarding layer for reducing an electron transport rate;

wherein in a direction away from the anode layer, the first functional layer group comprises a hole transport layer and the hole injection retarding layer stacked sequentially; or the first functional layer group comprises a hole transport layer, wherein doping particles for reducing the hole transport rate are distributed in the hole transport layer, and the hole transport layer is reused as the hole injection retarding layer.

* * * * *